United States Patent
Kim et al.

(10) Patent No.: US 8,995,475 B2
(45) Date of Patent: Mar. 31, 2015

(54) DIGITAL BROADCASTING TRANSMITTER AND RECEIVER, AND METHODS FOR PROCESSING STREAMS THEREOF

(75) Inventors: Jung-jin Kim, Seoul (KR); Hae-joo Jeong, Seoul (KR); Yong-sik Kwon, Seoul (KR); Eui-jun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1054 days.

(21) Appl. No.: 12/667,804

(22) PCT Filed: Jun. 30, 2008

(86) PCT No.: PCT/KR2008/003863
§ 371 (c)(1),
(2), (4) Date: Jan. 5, 2010

(87) PCT Pub. No.: WO2009/005281
PCT Pub. Date: Jan. 8, 2009

(65) Prior Publication Data
US 2010/0329382 A1    Dec. 30, 2010

Related U.S. Application Data

(60) Provisional application No. 60/948,119, filed on Jul. 5, 2007.

(51) Int. Cl.
*H04J 3/16*     (2006.01)
*H04H 20/30*    (2008.01)
(Continued)

(52) U.S. Cl.
CPC .......... *H04H 20/30* (2013.01); *H03M 13/1515* (2013.01); *H03M 13/23* (2013.01);
(Continued)

(58) Field of Classification Search
USPC ......... 370/310, 464, 465, 473, 477, 498, 522, 370/528, 529, 537; 725/143, 144, 146, 148
See application file for complete search history.

(56) References Cited

U.S. PATENT DOCUMENTS 5,757,416 A * 5/1998 Birch et al. .................. 725/144
6,414,970 B1 * 7/2002 Negishi et al. ............... 370/510
(Continued)

FOREIGN PATENT DOCUMENTS

| CN | 1946191 A | 4/2007 |
| CN | 1949835 A | 4/2007 |
| EP | 1 555 826 A1 | 7/2005 |
| WO | 95-34991 A1 | 12/1995 |
| WO | 2006/001635 A1 | 1/2006 |

OTHER PUBLICATIONS

Communication issued Dec. 20, 2010 by State Intellectual Property Office of P.R. China in counterpart Chinese Application No. 200880018944.4.

*Primary Examiner* — Curtis A Alia
(74) *Attorney, Agent, or Firm* — Sughrue Mion, PLLC

(57) ABSTRACT

A digital broadcast transmitter to transmit a plurality of supplementary data streams is provided, including a multiplexer (MUX) unit which generates a transmission stream by inserting the plurality of supplementary data streams into a normal data stream so that the plurality of supplementary data streams are continuously arranged in an alternating pattern in the normal data stream, and an exciter unit which processes the transmission stream so that the plurality of supplementary data streams are distinguishably arranged in a plurality of areas forming a plurality of transmission units.

38 Claims, 13 Drawing Sheets

(51) Int. Cl.
*H03M 13/15* (2006.01)
*H03M 13/23* (2006.01)
*H03M 13/25* (2006.01)
*H03M 13/27* (2006.01)
*H03M 13/29* (2006.01)
*H04L 5/00* (2006.01)
*H04N 21/2383* (2011.01)
*H04N 21/63* (2011.01)
*H04H 20/57* (2008.01)

(52) U.S. Cl.
CPC ........ *H03M13/256* (2013.01); *H03M 13/2707* (2013.01); *H03M 13/2732* (2013.01); *H03M 13/2972* (2013.01); *H04L 5/003* (2013.01); *H04N 21/2383* (2013.01); *H04N 21/631* (2013.01); *H03M 13/151* (2013.01); *H04H 20/57* (2013.01)
USPC .......................................... 370/528; 370/529

(56) References Cited

U.S. PATENT DOCUMENTS

| | | | |
|---|---|---|---|
| 6,556,639 | B1 | 4/2003 | Goldston et al. |
| 6,870,861 | B1* | 3/2005 | Negishi et al. ................. 370/537 |
| 7,030,935 | B2 | 4/2006 | Choi et al. |
| 7,450,613 | B2* | 11/2008 | Choi et al. ..................... 370/486 |
| 7,764,323 | B2 | 7/2010 | Choi et al. |
| 7,825,994 | B2 | 11/2010 | Choi et al. |
| 7,870,461 | B2* | 1/2011 | Yu et al. ......................... 714/755 |
| 2005/0162886 | A1* | 7/2005 | Jeong et al. ..................... 365/63 |
| 2006/0262227 | A1* | 11/2006 | Jeong ............................ 348/723 |
| 2006/0262863 | A1* | 11/2006 | Park et al. ................. 375/240.26 |
| 2007/0076829 | A1 | 4/2007 | Choi et al. |
| 2007/0081595 | A1 | 4/2007 | Choi et al. |
| 2008/0063089 | A1* | 3/2008 | Chen ........................ 375/240.26 |
| 2010/0220240 | A1 | 9/2010 | Choi et al. |
| 2010/0223652 | A1 | 9/2010 | Choi et al. |

* cited by examiner

DIGITAL BROADCASTING TRANSMITTER AND RECEIVER, AND METHODS FOR PROCESSING STREAMS THEREOF

CROSS-REFERENCE TO RELATED PATENT APPLICATION

This application is a National Stage application under 35 U.S.C. §371 of PCT/KR2008/003863 filed on Jun. 30, 2008, which claims priority from U.S. Provisional Application No. 60/948,119 filed on Jul. 5, 2007, all of which are incorporated herein in their entireties by reference.

BACKGROUND

1. Field

Apparatuses and methods consistent with the present inventive concept relate to a digital broadcast transmitter which processes and transmits transmission streams containing supplementary data streams, a digital broadcast receiver which receives the transmission streams, and methods for processing the transmission streams thereof.

2. Description of the Related Art

As digital technology has developed, digital processing systems in a display technical field, such as digital televisions, have become widely distributed. Accordingly, in order for digital televisions to receive and process digital broadcast data, diverse digital broadcast standards have been proposed.

Digital broadcasting has advantages such as enabling high definition broadcasting, and supporting transmission and reception of a greater amount of information having greater efficiency in transmitting radio waves than analog broadcasting. However, if transmission streams are broken by a magnetic field or an obstacle, broadcasting becomes unstable. Such problems frequently occur when digital broadcasting is received in a moving vehicle.

In order for users to receive digital broadcasting more stably in a moving vehicle, robust data streams which are processed to be more robust against errors than conventional data streams may be used. Accordingly, devices for transferring such new robust data streams are required, which may result in increased cost and time. Therefore, there is a need for devices and methods for effectively transferring robust data streams together with conventional data streams.

SUMMARY

An aspect of the present inventive concept provides a digital broadcast transmitter and receiver which provide digital broadcasting services with greater efficiency and stability by appropriately inserting a plurality of supplementary data streams into a normal data stream, and methods for processing the streams thereof.

According to an exemplary embodiment, there is provided a digital broadcast transmitter including a multiplexer (MUX) unit which generates a transmission stream by inserting a plurality of supplementary data streams into a normal data stream so that the plurality of supplementary data streams are continuously arranged in an alternating pattern in the normal data stream, and an exciter unit which processes the transmission stream so that the plurality of supplementary data streams are divided and arranged in a plurality of areas forming a plurality of transmission units.

The MUX unit may insert the plurality of supplementary data streams into a single stream unit of the normal data stream so that the plurality of supplementary data streams are continuously arranged to face each other diagonally in an alternating pattern in the single stream unit.

The MUX unit may repeatedly inserts the plurality of supplementary data streams so that a plurality of stream units having the same form as the single stream unit are arranged continuously in the normal data stream.

The MUX unit may insert a single supplementary data stream of the plurality of supplementary data streams into a stream unit of the normal data stream so that the single supplementary data stream is repeatedly arranged in the stream unit of the normal data in a triangular shape, and at least two supplementary data streams, excluding the single supplementary data stream, of the plurality of supplementary data streams are arranged vertically in a remaining area of the stream unit in an alternating pattern.

The MUX unit may repeatedly insert the plurality of supplementary data streams so that stream units having the same form as the stream unit are arranged continuously in the normal data stream.

The MUX unit may repeatedly insert the plurality of supplementary data streams so that the stream unit and a stream unit comprising at least another two supplementary data streams, of the plurality of supplementary data streams, which are continuously arranged along a diagonal boundary in an alternating pattern are arranged continuously in the normal data stream.

The MUX unit may insert the plurality of supplementary data streams into the normal data stream so that the exciter unit may process the transmission stream, at least two supplementary data streams of the plurality of supplementary data streams are arranged in a certain form in an entire area of at least one transmission unit of the plurality of transmission units, and remaining supplementary data streams of the plurality of transmission units are arranged in a horn area in at least another one transmission unit which precedes or follows the at least one transmission unit.

The exciter unit may include an interleaver which interleaves the transmission stream comprising the plurality of supplementary data streams so that the plurality of supplementary data streams are arranged in a plurality of areas which divide an entire area of the plurality of transmission units for transmitting the transmission stream.

The at least two supplementary data streams of the plurality of supplementary data streams may include different data, and be coded at different coding rates.

The plurality of supplementary data streams may be repeatedly arranged in the same pattern in every field which divides the transmission stream and may be transmitted.

The plurality of supplementary data streams may be arranged to be contained in a stream unit of multiple integers of 52, and the stream unit may be a segment or a packet.

According to another exemplary embodiment, there is provided a method for processing a transmission stream in a digital broadcast transmitter, the method including generating the transmission stream by inserting a plurality of supplementary data streams into a normal data stream so that the plurality of supplementary data streams are continuously arranged in an alternating pattern in the normal data stream, and processing the transmission stream so that the plurality of supplementary data streams are divided and arranged in a plurality of areas forming a plurality of transmission units.

In the generating the transmission stream, the plurality of supplementary data streams may be inserted into the stream unit of the normal data stream so that a plurality of stream units having the same form as the single stream unit comprising the alternately arranged supplementary data streams are arranged continuously in the normal data stream.

In the generating the transmission stream, the plurality of supplementary data streams may be repeatedly inserted so that stream units having the same form as the stream unit are arranged continuously in the normal data stream.

The generating the transmission stream may include repeatedly arranging a single supplementary data stream of the plurality of supplementary data streams in a triangular shape in a stream unit of the normal data, and vertically arranging at least two supplementary data streams, excluding the single supplementary data stream, of the plurality of supplementary data streams in an alternating pattern in a remaining area of the stream unit.

The generating the transmission stream may further include repeatedly inserting the plurality of supplementary data streams so that stream units having the same form as the stream unit are arranged continuously in the normal data stream.

The generating the transmission stream may further include repeatedly inserting the plurality of supplementary data streams so that the stream unit and a stream unit comprising at least another two supplementary data streams, of the plurality of supplementary data streams, which are arranged along a diagonal boundary in an alternating pattern are arranged continuously in the normal data stream.

The inserting the plurality of supplementary data streams into the normal data stream may be performed such that, as a result of the processing the transmission stream, at least two supplementary data streams of the plurality of supplementary data streams are distinguishably arranged in a certain form in an entire area of at least one transmission unit of the plurality of transmission units, and remaining supplementary data streams of the plurality of transmission units are arranged in a horn area in at least another one transmission unit which precedes or follows the at least one transmission unit.

In the processing the transmission stream, the transmission stream comprising the plurality of supplementary data streams may be interleaved so that the plurality of supplementary data streams are arranged in a plurality of areas which divide an entire area of the plurality of transmission units for transmitting the transmission stream.

At least two supplementary data streams of the plurality of supplementary data streams may include different data, and may be coded at different coding rates.

The plurality of supplementary data streams may be repeatedly arranged in the same pattern in every field which divides the transmission stream and may be transmitted.

The plurality of supplementary data streams may be arranged to be contained in a stream unit of multiple integers of 52, and the stream unit may be a segment or a packet.

According to another exemplary embodiment, there is provided a digital broadcast receiver including a reception unit which receives a transmission stream comprising a normal data stream and a plurality of supplementary data streams, a demodulation unit which demodulates the transmission stream, an equalization unit which equalizes the demodulated transmission stream, and a decoding unit which decodes at least one supplementary data stream of the plurality of supplementary data streams. Here, the transmission stream has been formed by inserting the plurality of supplementary data streams into the normal data stream so that the plurality of supplementary data streams are continuously arranged in an alternating pattern in the normal data stream, and the transmission stream has been processed such that the plurality of supplementary data streams are divided and arranged in a plurality of areas forming a plurality of transmission units.

The transmission stream has been processed so that at least two supplementary data streams of the plurality of supplementary data streams are arranged in a certain form in an entire area of at least one transmission unit of the plurality of transmission units, and remaining supplementary data streams are arranged in a horn area in at least another one transmission unit which precedes or follows the at least one transmission unit.

At least two supplementary data streams of the plurality of supplementary data streams may have the same symbol forms which are transmitted at predetermined time intervals.

At least two supplementary data streams of the plurality of supplementary data streams may include different data, and be coded at different coding rates.

The plurality of supplementary data streams may have been repeatedly arranged in the same pattern in every field which divides the transmission stream and is transmitted.

The plurality of supplementary data streams may have been inserted into the normal data stream having segments or packets of multiple integers of 52, and have been interleaved and transmitted to the digital broadcast receiver.

According to another exemplary embodiment, there is provided a method for processing a stream in a digital broadcast receiver, the method including receiving the transmission stream comprising a normal data stream and a plurality of supplementary data streams, demodulating the transmission stream, equalizing the demodulated transmission stream, and decoding at least one supplementary data stream of the plurality of supplementary data streams. Here, the transmission stream has been formed by inserting the plurality of supplementary data streams into the normal data stream so that the plurality of supplementary data streams are continuously arranged in an alternating pattern in the normal data stream, and the transmission stream has been processed such that the plurality of supplementary data streams are divided and arranged in a plurality of areas forming a plurality of transmission units.

The transmission stream has been processed so that at least two supplementary data streams of the plurality of supplementary data streams are arranged in a certain form in an entire area of at least one transmission unit of the plurality of transmission units, and remaining supplementary data streams are arranged in a horn area in at least another one transmission unit which precedes or follows the at least one transmission unit.

At least two supplementary data streams of the plurality of supplementary data streams may have the same symbol forms which have been transmitted at predetermined time intervals.

At least two supplementary data streams of the plurality of supplementary data streams may include different data, and have been coded at different coding rates.

The plurality of supplementary data streams have been repeatedly arranged in the same pattern in every field which divides the transmission stream and transmitted.

The plurality of supplementary data streams have been inserted into the normal data stream having segments or packets of multiple integers of 52, and have been interleaved and transmitted to the digital broadcast receiver.

As can be appreciated from the above description, since a plurality of supplementary data streams are appropriately inserted into a normal data stream, transmitted and received, a digital broadcast service may be provided with greater efficiency and stability.

DETAILED DESCRIPTION OF EXEMPLARY EMBODIMENTS

Figure 1:
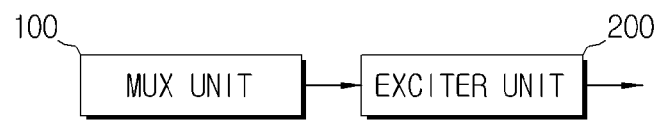
FIG. 1 is a schematic block diagram illustrating the structure of a digital broadcast transmitter according to an exemplary embodiment.

Reference will now be made in detail to the exemplary embodiments in reference with the accompanying drawings, wherein like reference numerals refer to the like elements throughout. The exemplary embodiments are described below in order to explain the present inventive concept by referring to the figures.

FIG. 1 is a schematic block diagram illustrating the structure of a digital broadcast transmitter according to an exemplary embodiment. The digital broadcast transmitter includes a multiplexer (MUX) unit 100 and an exciter unit 200.

The MUX unit 100 constructs a transmission stream containing a normal data stream and supplementary data streams. A normal data stream refers to a data stream which is conventionally transmitted by a digital broadcast system. Supplementary data streams refers to data streams which are processed in a coding manner or at a coding rate different from the normal data stream, and thus are robust streams which are strong against errors. However, the supplementary data streams may share the same data with the normal data stream.

The MUX unit 100 forms a plurality of supplementary data streams in an appropriate format, and inserts the formatted supplementary data streams into a normal data stream, so a transmission stream is constructed. More specifically, the MUX unit 100 inserts a plurality of supplementary data streams into a normal data stream unit so that the plurality of supplementary data streams can be arranged continuously and alternately in a stream unit of normal data in a preset pattern. The stream unit refers to a unit by which whole normal data are divided by a predetermined size, such as a segment or a packet.

The exciter unit 200 processes the transmission stream constructed by the MUX unit 100, and transmits the transmission stream through a channel. The exciter unit 200 distinguishably arranges normal data streams and a plurality of supplementary data streams in a plurality of sections within at least one transmission stream. The plurality of sections refer to sections into which at least one transmission stream are divided. That is, the exciter unit 200 processes at least one transmission stream to contain only supplementary data streams instead of a normal data stream. This operation can be performed by an interleaver (not shown) in the exciter unit 200.

Figure 2A:
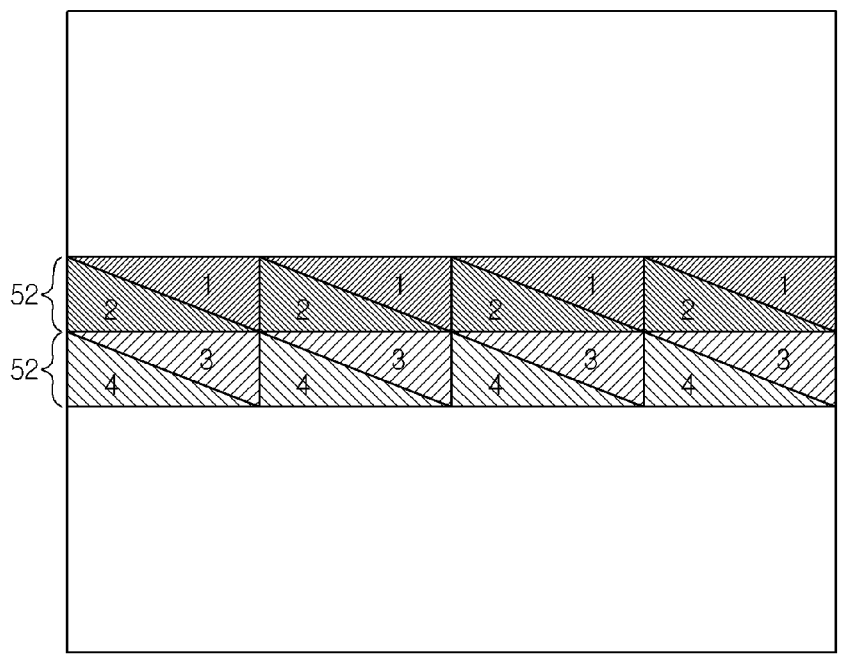
FIGS. 2A and 2B are schematic diagrams illustrating an example of streams processed by the digital broadcast transmitter.
Figure 2B:
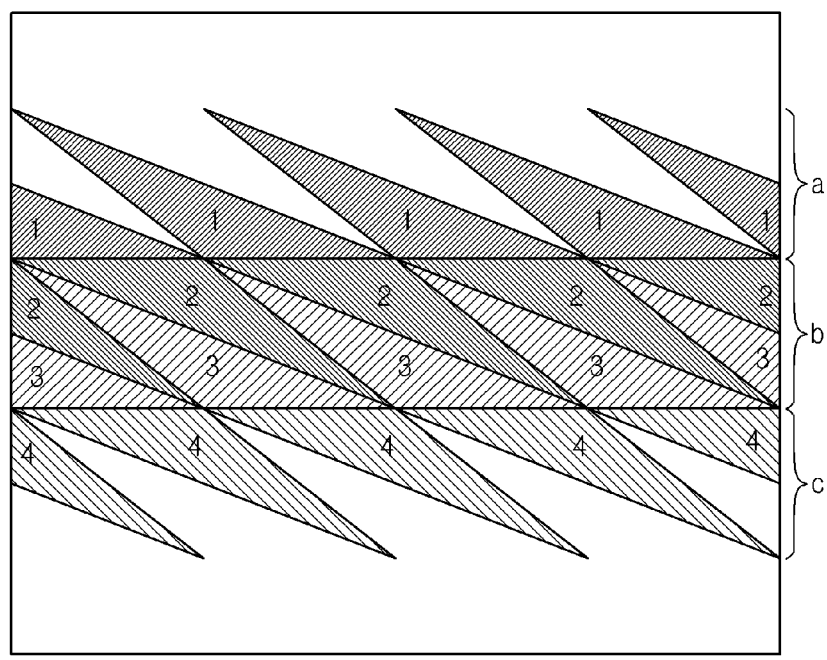

FIGS. 2A and 2B are schematic diagrams illustrating an example of streams processed by the digital broadcast transmitter of FIG. 1. In FIGS. 2A and 2B, four supplementary data streams are inserted into a normal data stream as an example, but the number of inserted supplementary data streams can be modified as an exemplary embodiment.

FIG. 2A illustrates the structure of a transmission stream constructed by the MUX unit 100. The transmission stream is divided into a plurality of stream units. A single stream unit indicates a stream from leftmost to rightmost, and can be a segment or a packet.

FIG. 2A may indicate a single field or frame. The number of segments constituting a single field can be set according to a corresponding standard. For example, a total of 312 segments may constitute a single field. In addition, if a segment is used as a stream unit, a first supplementary data stream 1 and a second supplementary data stream 2 are arranged, facing each other diagonally, in 52 consecutive segments of a field. In a segment subsequent to the last segment in which the first and second supplementary data streams 1 and 2 are arranged, third and fourth supplementary data streams 3 and 4 are arranged in the same manner.

If such a transmission stream is processed by the exciter unit 200, the first to fourth supplementary data streams 1 to 4 are arranged in the transmission stream as illustrated in FIG. 2B.

In this case, the first to fourth supplementary data streams 1 to 4 are arranged in burst areas a, b, and c of the transmission stream. Among the plurality of supplementary data streams, the second and third supplementary data streams 2 and 3 entirely occupy one area of at least one transmission unit b, and are distinguishably arranged in a diagonally alternating pattern to each other. In this case, the transmission unit in which the second and third supplementary data streams are located may be a packet or segment, and the transmission unit may include one or more packets or segments.

The remaining supplementary data streams, that is, the first and fourth supplementary data streams are arranged in areas having triangular shaped transmission units a and c which are prior to or next to the at least one transmission unit in which the second and third supplementary data streams are arranged.

As described above, since the MUX unit 100 inserts a plurality of supplementary data streams into a normal data stream in an appropriate pattern, only the supplementary data streams exist in a certain area b of an interleaved transmission stream without being mixed with the normal data stream. If supplementary data streams are mixed with a normal data stream in a single transmission unit, a decoder of a receiver which is capable of processing only supplementary data streams must be operated even while the normal data stream is being received. Therefore, the power consumption efficiency of the receiver is reduced. In addition, as illustrated in FIG. 2B, when supplementary data streams are transmitted using an entire transmission unit, a same symbol can be transmitted while the transmission unit is being transmitted. In this case, a stream structure as in FIG. 2B is repeated field by field or frame by frame, and the same symbol can be transmitted field by field or frame by frame. If the same symbol is transmitted, a receiver can improve the performance of equalization and synchronization.

Figure 3A:
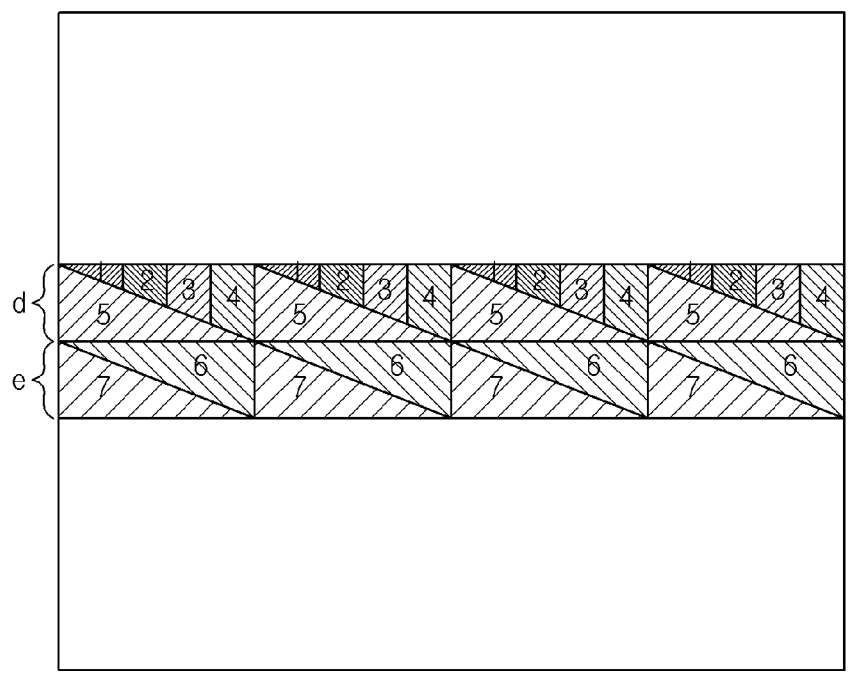
FIGS. 3A and 3B are schematic diagrams illustrating another example of streams processed by the digital broadcast transmitter.
Figure 3B:
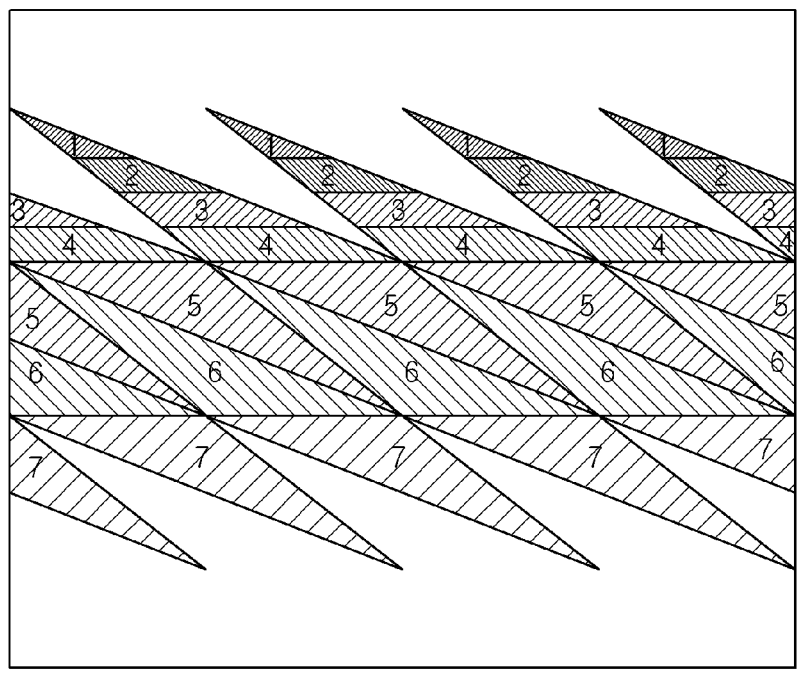

FIGS. 3A and 3B are schematic diagrams illustrating another example of streams processed by a digital broadcast transmitter according to an exemplary embodiment. In FIG.

3A, a total of seven supplementary data streams are inserted into a transmission stream as an example.

FIG. 3A illustrates the structure of a transmission stream constructed by the MUX unit 100. By the operation of the MUX unit 100, from among a plurality of supplementary data streams, a supplementary data stream 5 is formed in a series of triangular shapes in a stream unit d, and a plurality of supplementary data streams 1 to 4 are vertically inserted into the remaining area of the stream unit d in an alternating pattern. The number of supplementary data streams 1 to 4 which are vertically arranged can be modified.

In a stream unit e next to the stream unit d, two supplementary data streams 6 and 7 are arranged facing each other diagonally.

The exciter unit 200 processes the transmission stream of FIG. 3A so that, as illustrated in the lower drawing of FIG. 3B, the first to fourth supplementary data streams 1 to 4 and the seventh supplementary data stream 7 are arranged in a horn shape, and the fifth and sixth supplementary data streams 5 and 6 are arranged facing each other diagonally and fill at least one transmission unit.

In FIG. 3A, the arrangement patterns of supplementary data streams in stream units d and e are different. The arrangement pattern of supplementary data streams in stream unit d may be used repeatedly. In this case, the arrangement pattern of supplementary data streams in the transmission stream of FIG. 3B may change.

In addition, in FIG. 3A, the plurality of supplementary data streams 1 to 4 are arranged in an area corresponding to the first supplementary data stream 1 of FIG. 2A, but a plurality of supplementary data streams may be arranged in the location of at least one of the fifth to seventh supplementary data streams 5, 6, and 7 of FIG. 3A in the same manner. Each supplementary data stream may have the same coding rate and data, partly the same coding rate and data, or an entirely different coding rate and data.

FIGS. 2A, 2B, 3A and 3 illustrate a multiplexing method of the MUX unit 100 and the structures of a transmission stream processed by the exciter unit 200 in diverse ways, and the number of supplementary data streams and the arrangement patterns can also be modified in diverse ways.

Each of the first to fourth supplementary data streams 1 to 4 in FIGS. 2A and 2B, and the first to seventh supplementary data streams 1 to 7 in FIGS. 3A and 3B may transmit different data entirely, partly, or respectively, or the same data. In addition, the coding rate of each supplementary data stream may be different, or the same.

That is, each supplementary data stream may have a different coding rate and different data, part of the supplementary data streams (for example, the first and second supplementary data streams) may have the same coding rate or the same data, or all of the supplementary data streams may have the same coding rate and the same data. Accordingly, each supplementary data stream can be defined in diverse forms and provided from diverse sources.

Figure 4:
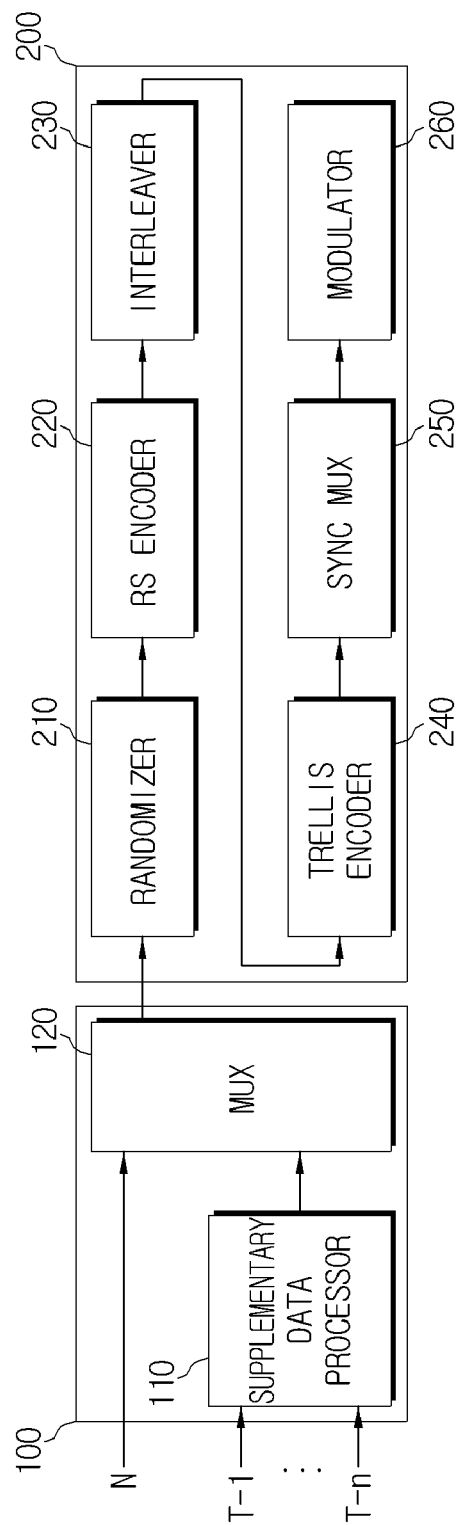
FIG. 4 is a block diagram illustrating an example of the detailed structure of the digital broadcast transmitter.

FIG. 4 is a block diagram illustrating an example of the detailed structure of a digital broadcast transmitter according to an exemplary embodiment. In FIG. 4, the MUX unit 100 includes a supplementary data processor 110 and a MUX 120, and the exciter unit 200 includes a randomizer 210, a Reed-Solomon (RS) encoder 220, an interleaver 230, a trellis encoder 240, a sync MUX 250, and a modulator 260.

The supplementary data processor 110 processes a plurality of supplementary data streams. That is, the supplementary data processor 110 receives data streams T-1 to T-n from internal or external sources so that they may be inserted into a normal data stream and be additionally transmitted, processes the data streams T-1 to T-n to be robust against errors, and provides the MUX 120 with the processed data streams.

The MUX 120 inserts the plurality of supplementary data streams received from the supplementary data processor 110 into a normal data stream N so that a transmission stream is generated.

The randomizer 210 randomizes the transmission stream.

The RS encoder 220 encodes the randomized transmission stream, and the interleaver 230 interleaves the encoded transmission stream. The trellis encoder 240 performs trellis-encoding of the interleaved transmission stream and provides the sync MUX 250 with the trellis-encoded transmission stream.

Although not illustrated in FIG. 4, the digital broadcast transmitter may further include a known data inserter (not shown) which inserts known data into the transmission stream. Known data are data which are known to both a transmitter and a receiver. If known data are inserted into a transmission stream and transmitted to a receiver, the receiver identifies and uses the known data for demodulation and equalization. As a result, the reception performance of the receiver can be increased.

If the known data are inserted, the trellis encoder 240 can perform trellis reset at an appropriate time. That is, the trellis encoder 240 uses a plurality of internal memories (for example, three shift registers) during the trellis encoding operation, and when the known data are trellis-encoded, values of the known data may be modified by values which were previously stored in the internal memories. In order to prevent this problem, before processing the known data, trellis reset may be performed to reset the internal memories to be initial values. If trellis reset is performed, parity correction may be performed in order to prevent a parity from being changed by trellis reset. In this case, an RS re-encoder (not shown) may be further added.

The sync MUX 250 inserts a field sync and a segment sync into the trellis-encoded transmission stream.

The modulator 260 modulates the transmission stream processed by the sync MUX 250, and transmits the modulated transmission stream to a receiver via a channel. In greater detail, the modulator 260 converts the transmission stream to a signal in a radio frequency (RF) channel band by performing vestigial sideband (VSB) modulation and RF modulation.

Further elements can be added to the structure of FIG. 4 in another exemplary embodiment. For example, a pilot inserter (not shown), which inserts a pilot into a transmission stream by adding a direct current (DC) value, and an equalizer (not shown), which equalizes a dual transmission stream into which the pilot is inserted in order to minimize interference between symbols, can be further added.

Furthermore, in other exemplary embodiments, part of the elements illustrated in FIG. 4 can be deleted and the arrangement order of the elements can be modified. For example, the randomizer 210 can be deleted.

Figure 5:
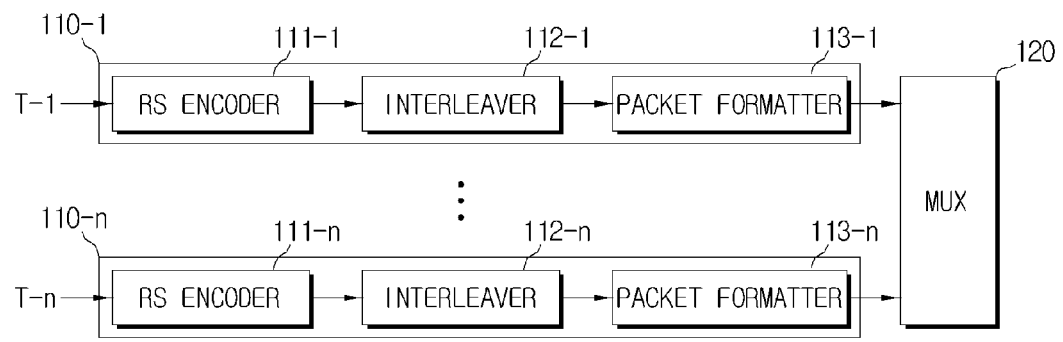
FIG. 5 is a block diagram illustrating an example of the structure of a supplementary data processor of the digital broadcast transmitter.

FIG. 5 is a block diagram illustrating an example of the detailed structure of the supplementary data processor 110 of FIG. 4. The supplementary data processor 110 includes a plurality of pre-processors 110-1 to 110-*n*. The pre-processors 110-1 to 110-*n* include respective RS encoders 111-1 to 111-*n*, interleavers 112-1 to 112-*n*, and packet formatters 113-1 to 113-*n*. The number of pre-processors 110-1 to 110-*n* may vary according to the number of supplementary data streams.

Supplementary data streams T-1 to T-n which are input to the pre-processors 110-1 to 110-*n* are encoded by the RS encoders 111-1 to 111-*n*, and interleaved by the interleavers 112-1 to 112-*n*, respectively.

The packet formatters 113-1 to 113-*n* perform packet formatting of the supplementary data streams T-1 to T-n output from the interleavers 112-1 to 112*n*.

In detail, the packet formatters 113-1 to 113-*n* perform packet formatting by inserting a packet identification (PID) into the supplementary data streams T-1 to T-n, or by inserting the supplementary data streams T-1 to T-n into a normal data stream.

For example, if a transmission stream is configured as illustrated in FIGS. 2A and 2B, the pre-processors 110-1 to 110-*n* are implemented as four units. In this case, the first packet formatter 113-1 in the first pre-processor 110-1 ensures a space in the first supplementary data stream T-1, so the supplementary data stream T-1 is formatted to be arranged in a series of triangular shapes as illustrated in FIG. 2A.

In the same manner, the second packet formatter 113-2 in the second pre-processor 110-2 performs formatting, so the second supplementary data stream 2 is disposed opposite the first supplementary data stream T-1 and is formed as a series of triangular shapes.

The supplementary data streams formatted in this manner are provided to the MUX 120, and the MUX 120 multiplexes the supplementary data streams so that a transmission stream can be generated as illustrated in FIG. 2A.

As a result of RS encoding, interleaving, and packet formatting, the supplementary data streams can be robust against errors.

The transmission stream generated by the MUX unit 100 as described above is processed by the exciter unit 200 and transmitted to a receiver. As illustrated in FIGS. 2A and 2B or FIGS. 3A and 3B, the exciter unit 200 interleaves the transmission stream so that a transmission unit which is filled with only a plurality of supplementary data streams can be generated.

Figure 6:
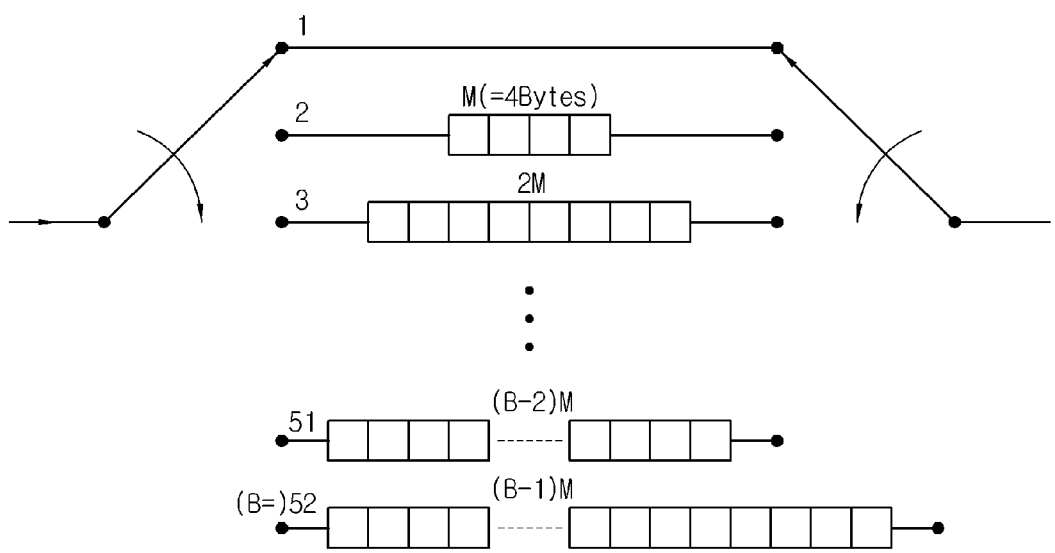
FIG. 6 is a schematic diagram illustrating an example of the structure of an interleaver of the digital broadcast transmitter.

To do this, the interleaver 230 of FIG. 4 may be configured as illustrated in FIG. 6, which is a schematic diagram illustrating an example of the structure of an interleaver. In FIG. 6, the interleaver may be implemented as a convolutional byte interleaver. As in the above examples, if a single field consists of 312 segments, the interleaver 230 may be operated in a 52 data segment unit.

In FIG. 6, a transmission stream output by the RS encoder 220 is separated into bytes, is stored in a plurality of shift registers in sequence, and is output to the trellis encoder 240 in sequence. Since interleaving is performed in a byte unit, the format of the transmission stream is generated as illustrated in FIG. 2B or FIG. 3B.

Figure 7:
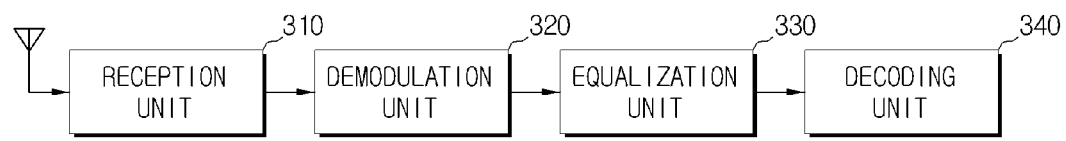
FIG. 7 is a schematic block diagram illustrating the structure of a digital broadcast receiver according to an exemplary embodiment.

FIG. 7 is a schematic block diagram illustrating the structure of a digital broadcast receiver according to an exemplary embodiment. The digital broadcast receiver includes a reception unit 310, a demodulation unit 320, an equalization unit 330, and a decoding unit 340.

The reception unit 310 receives a transmission stream containing a plurality of supplementary data streams, and may be implemented as a tuner.

The demodulation unit 320 demodulates the transmission stream received through the reception unit 310, and the equalization unit 330 equalizes the demodulated transmission stream.

The decoding unit 340 decodes at least one supplementary data stream from among the equalized transmission stream so that the supplementary data are restored. That is, the decoding unit 340 may decode part of the plurality of supplementary data streams, in particular, a single supplementary data stream, and discard the remaining supplementary data streams. Alternatively, the decoding unit 340 may decode all of the plurality of supplementary data streams in order to restore them, or may decode normal data as well as supplementary data.

The transmission stream received by the reception unit 310 is a transmission stream which the digital broadcast transmitter of FIG. 1 has transmitted. That is, in the received transmission stream, a plurality of supplementary data streams may be inserted into a plurality of areas constituting at least one transmission unit from among the transmission units of the transmission stream. That is, the received transmission stream may have the structure as illustrated in FIGS. 2A and 2B or FIGS. 3A and 3B. The plurality of supplementary data streams may be contained in segments or packets of multiples of 52.

Figure 8:
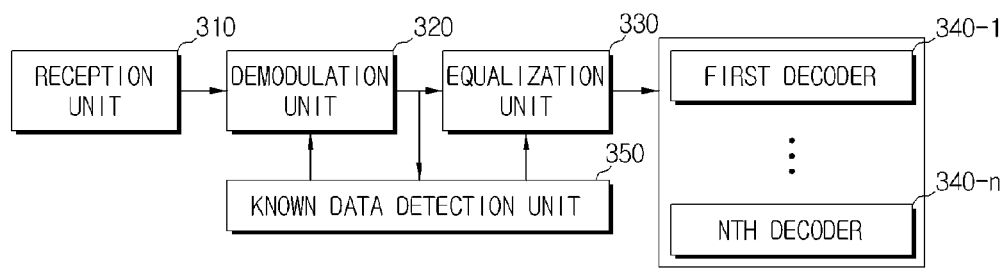
FIG. 8 is a block diagram illustrating an example of the detailed structure of the digital broadcast receiver.

FIG. 8 is a block diagram illustrating an example of the detailed structure of the digital broadcast receiver of FIG. 7. In FIG. 8, the digital broadcast receiver may further include a known data detection unit 350 in addition to the reception unit 310, the demodulation unit 320, the equalization unit 330, and the decoding unit 340.

The decoding unit 340 may include a plurality of decoders 340-1 to 340-*n*. Each decoder decodes a single supplementary data stream. As described above, if the decoding unit 340 processes only a single supplementary data stream, the decoding unit 340 may consist of a single decoder.

The known data detection unit 350 detects known data from the transmission stream and provides the demodulation unit 320 or the equalization unit 330 with the detected known data. The known data are used for demodulation or equalization so that the reception quality can be improved.

Figure 9:
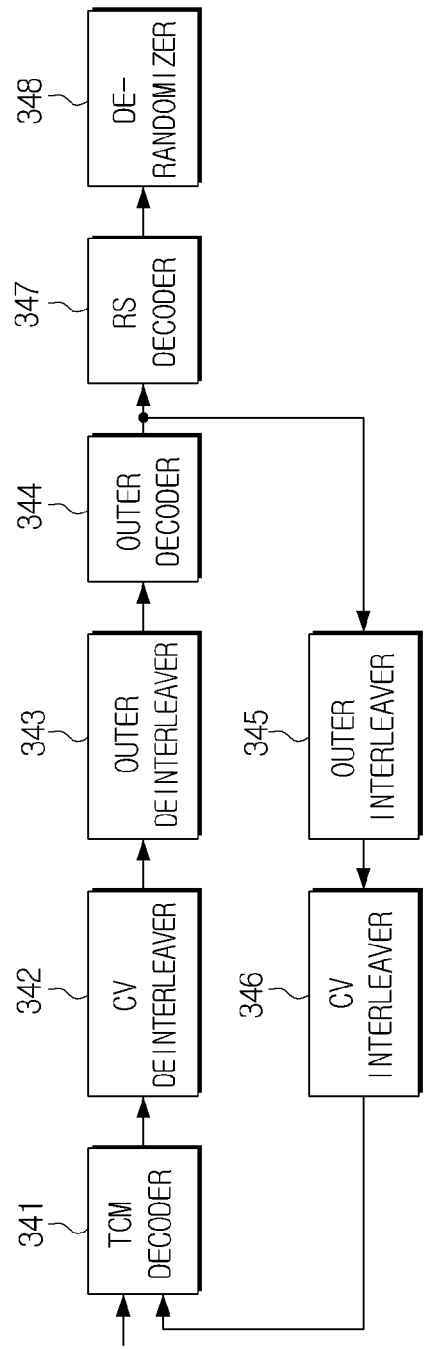
FIG. 9 is a block diagram illustrating an example of the structure of a decoder of the digital broadcast receiver.

FIG. 9 is a block diagram illustrating an example of the detailed structure of a first decoder 340-1. The first decoder 340-1 includes a trellis coded modulation (TCM) decoder 341, a convolutional (CV) deinterleaver 342, an outer deinterleaver 343, an outer decoder 344, an outer interleaver 345, a CV interleaver 346, an RS decoder 347, and a de-randomizer 348.

The TCM decoder 341 performs trellis decoding of a supplementary data stream from a transmission stream.

The CV deinterleaver 342 performs convolutional deinterleaving of the trellis-decoded supplementary data stream, and the outer deinterleaver 343 performs outer deinterleaving of the CV-deinterleaved supplementary data stream. Subsequently, the outer decoder 344 decodes the outer-deinterleaved supplementary data stream, and removes an added parity from the supplementary data stream.

In addition, the outer decoder 344 outputs a soft decision value or a hard decision value according to the results of decoding. If a hard decision value is output, the supplementary data stream output by the outer decoder 344 is transmitted to the RS decoder 347. If a soft decision value is output, the supplementary data stream output by the outer decoder 344 is transmitted to the outer interleaver 345.

The outer interleaver 345 interleaves the supplementary data stream and provides it with the CV interleaver 346. The CV interleaver 346 performs convolutional interleaving of the supplementary data stream and outputs it to the TCM decoder 341. In this manner, trellis decoding is repeated until a hard decision is output, and thus a reliable decoding value can be obtained.

In another exemplary embodiment, the outer decoder 344 may provide the RS decoder 347 with a soft decision.

In yet another exemplary embodiment, in order to reduce complexity in hardware, a hard decision may be provided to the outer interleaver 345.

In yet another exemplary embodiment, trellis decoding may be set to be repeated preset numbers of times without using a soft decision value or a hard decision value.

As described above, the trellis-decoded supplementary data stream is output to the RS decoder 347. The RS decoder 347 performs RS decoding of the supplementary data stream, and the de-randomizer 348 de-randomizes the supplementary data stream so that the supplementary data stream is restored.

Some of the elements in FIG. 9 can be deleted according to an exemplary embodiment, or a new element can be added. Moreover, the arrangement order of the elements can be modified.

Figure 10:
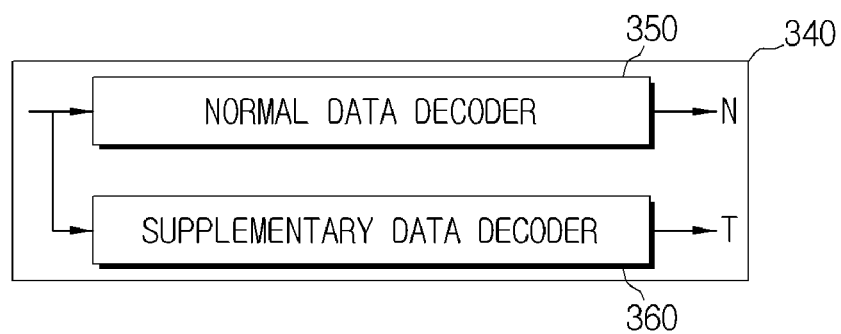
FIG. 10 is a block diagram illustrating another example of the structure of a decoder of the digital broadcast receiver.

FIG. 10 is a block diagram illustrating another example of the structure of the decoding unit 340. The decoding unit 340 includes a normal data decoder 350 and a supplementary data decoder 360.

The supplementary data decoder 360 may decode a supplementary data stream in the process illustrated in FIG. 9.

The normal data decoder 350 decodes a normal data stream from a transmission stream so that the normal data stream can be restored. That is, the normal data decoder 350 may include a decoder (not shown) such as a viterbi decoder, a deinterleaver, an RS decoder, and a de-randomizer.

As illustrated in FIG. 10, since the decoding unit 340 includes the normal data decoder 350 and the supplementary data decoder 360, the digital broadcast receiver can receive both a conventional normal data service and a supplementary data service.

As described above, in the digital broadcast transmitter according to the exemplary embodiment, a transmission stream is generated by continuously inserting a plurality of supplementary data streams into a normal data stream in an alternating pattern, and then is processed and transmitted.

The transmission stream may be configured as illustrated in FIGS. 2A and 2B or FIGS. 3A and 3B, and can also be configured in diverse structures other than these.

In FIGS. 2A and 2B, the first and second supplementary data stream and the third and fourth supplementary data streams are arranged diagonally in a precise ratio in 52 segments, respectively, but the number of segments and the arrangement ratio can be changed. More specifically, a transmission stream can be processed in the structure illustrated in FIGS. 11A and 11B.

Figure 11A:
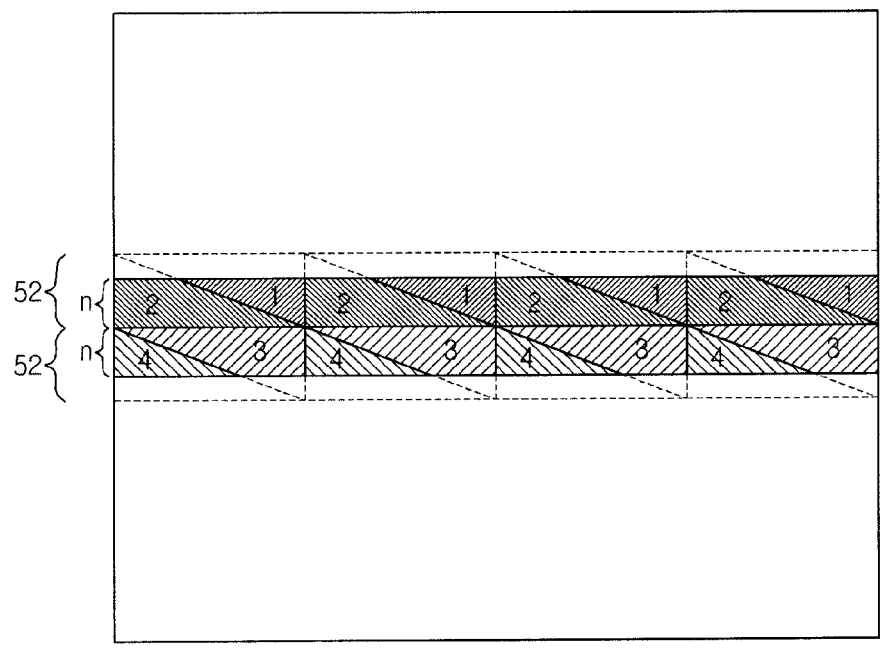
FIGS. 11A, 11B, 12 and 13 are schematic diagrams illustrating examples of the structure of a transmission stream.
Figure 11B:
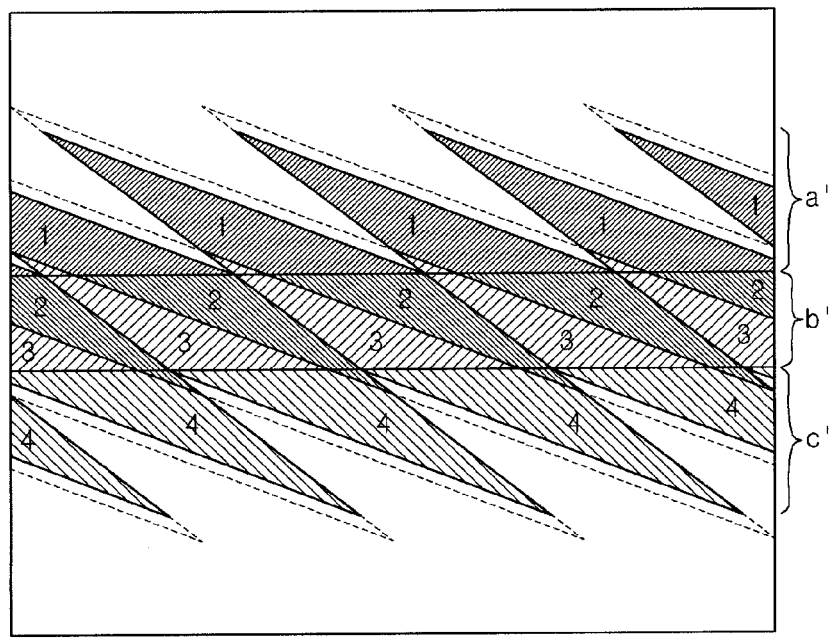

FIGS. 11A and 11B illustrate a transmission stream generated by inserting four supplementary data streams into a normal data stream similarly to that illustrated in FIGS. 2A and 2B. In FIGS. 11A and 11B, the first to fourth supplementary data streams are arranged diagonally in pair.

As illustrated in FIG. 11A, the first and second supplementary data streams 1 and 2 are not necessarily arranged within 52 stream units. That is, the first and second supplementary data streams 1 and 2 may be arranged in stream units smaller than the 52 stream unit, and also can be arranged in stream units greater than the 52 stream unit. In FIG. 11A, a dotted line indicates an area in which the supplementary data streams 1 to 4 occupy in a transmission stream of FIG. 2A. The number n of stream units in which a pair of supplementary data streams are arranged can be appropriately set according to the system.

In addition, as illustrated in FIG. 11A, the first and second supplementary data streams 1 and 2 may be arranged in a non-precise ratio in the stream unit n. In FIG. 2A, the first and second supplementary data streams 1 and 2 are each divided into halves, with one half of each data stream in one group on the basis of a diagonal line connecting two edges. However, as illustrated in FIG. 11A, the MUX unit 100 may divide the first and second supplementary data streams 1 and 2 by a diagonal line connecting one edge to a point on one side. Alternatively, the MUX unit 100 may divide the first and second supplementary data streams 1 and 2 by a diagonal line connecting a point on a first side to a point on a second side facing the first side.

In this case, if the exciter unit 200 performs interleaving, a transmission stream is configured as illustrated in FIG. 11B. That is, since the first and fourth supplementary data streams 1 and 4, and the second and third supplementary data streams 2 and 3 are partially arranged in the upper and lower horn parts a' and c', the size of a central area b' is less than the size of the area b in FIG. 2B and the size of the upper and lower horns a' and c' are greater than the size of the areas a and b in FIG. 2B.

Figure 12:
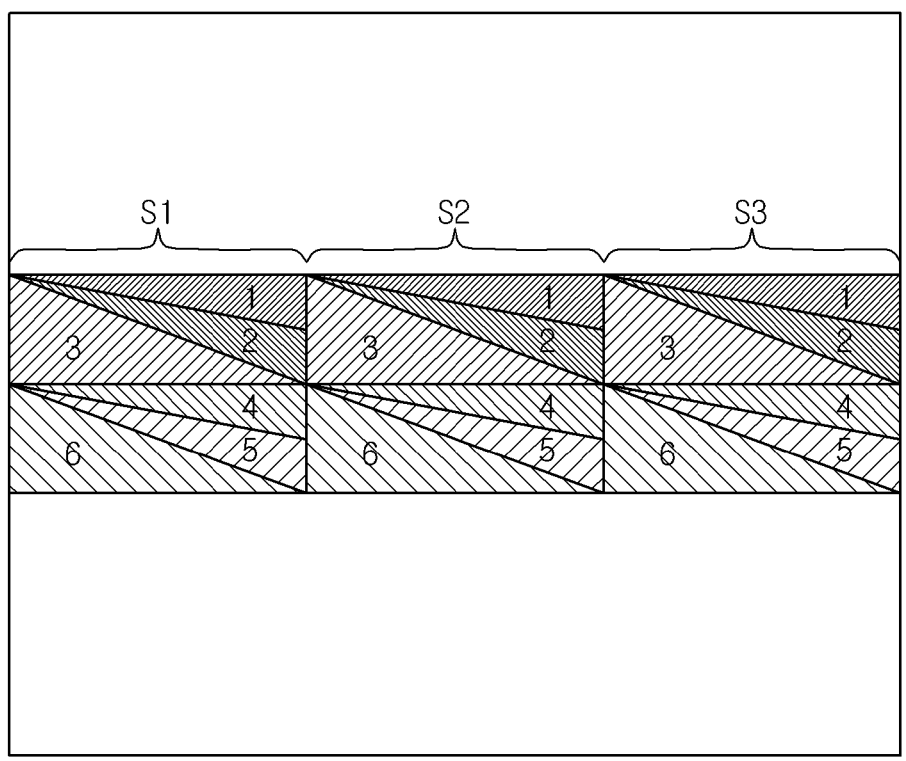
Figure 13:
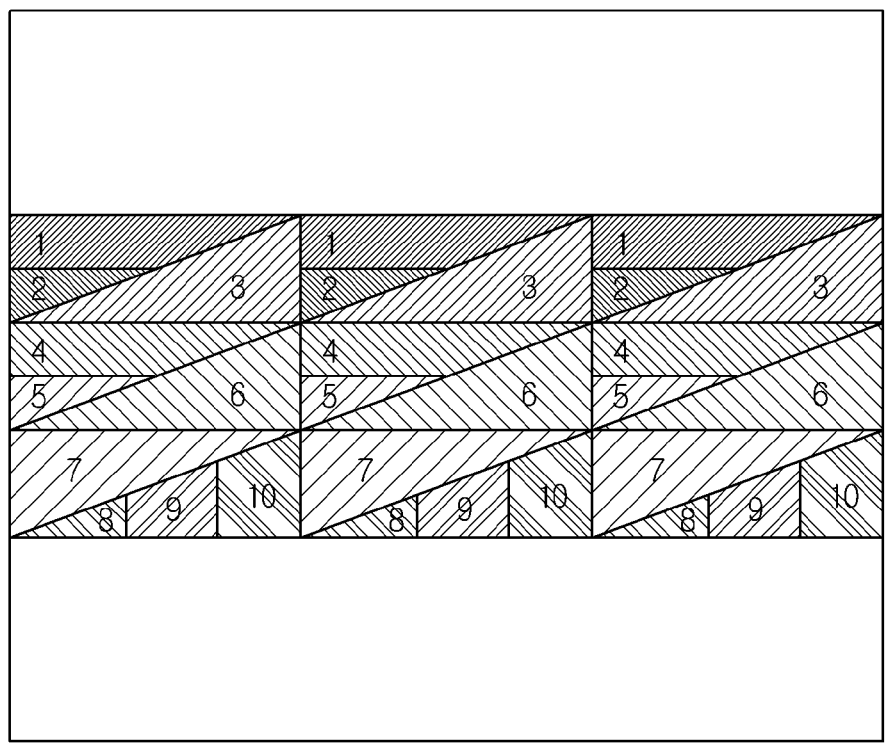

FIGS. 12 and 13 also illustrate examples of the structure of a transmission stream output by the MUX unit 100.

In FIG. 12, a plurality of supplementary data streams 1 to 3 or 4 to 6 may be arranged in particular numbers of stream units. The first to third supplementary data streams 1 to 3 are arranged repeatedly in a plurality of groups s1, s2, and s3. In FIGS. 2A, 2B, 3A, 3B, 11A and 11, the supplementary data streams are divided into 4 groups, but the number of groups can be modified as illustrated in FIG. 12.

In each group s1, s2, or s3, the third supplementary data stream occupies half of the area, and the two supplementary data streams 1 and 2 are arranged in the remaining area. The fourth to sixth supplementary data streams may be arranged in the same manner.

Subsequently, as illustrated in FIG. 13, the direction of a diagonal line may be reversed. In addition, as illustrated in FIG. 13, a plurality of supplementary data streams may be arranged in diverse forms such as a triangular pattern, a horizontal arrangement pattern, or a vertical arrangement pattern, in each group in a stream unit.

Such structures of a transmission stream are not limited to the drawings described above, and may be configured in diverse changeable forms.

In addition, a plurality of supplementary data streams may be arranged in any area of a transmission stream. That is, the location of a plurality of supplementary data does not have to be limited to a particular area based on the location of a field sync.

Generating the transmission stream is carried out by the MUX unit 100 of FIG. 1, and processing and transmitting the transmission stream is carried out by the exciter unit 200 of FIG. 1.

Furthermore, in the digital broadcast receiver according to the exemplary embodiment, a transmission stream including a plurality of supplementary data streams which are processed to be arranged in a plurality of areas including at least one transmission unit is received, demodulated, and equalized, and at least one supplementary data stream from among the equalized supplementary data streams is decoded. This process is illustrated in FIGS. 7 to 10.

Such methods for processing a stream by the digital broadcast transmitter and the digital broadcast receiver are described with reference to FIGS. 1 to 10, so a flow chart for detailed description is omitted here.

Although a few exemplary embodiments have been shown and described, it would be appreciated by those skilled in the art that changes may be made in different exemplary embodiments without departing from the principles and spirit of the inventive concept, the scope of which is defined in the claims and their equivalents.

The invention claimed is:

1. A digital broadcast transmitter, comprising:
a multiplexer (MUX) unit configured to generate a transmission stream comprising a plurality of segments by multiplexing supplementary data and normal data; and
an exciter unit configured to interleave the transmission stream such that at least one segment of the plurality of segments comprises only the supplementary data among the supplementary data and the normal data, and another at least one segment of the plurality of segments comprises both the supplementary data and the normal data,
wherein the supplementary data arranged in the other at least one segment forms a plurality of horn-shape areas protruding from the at least one segment in the transmission stream, and the normal data is arranged between the horn-shape areas, and
wherein the supplementary data is data which is processed to be more robust against errors than the normal data, and is different from known data used for demodulation and equalization of the transmission stream at a digital broadcast receiver.

2. The digital broadcast transmitter according to claim 1, wherein the MUX unit is configured to multiplex the supplementary data comprising a plurality of supplementary data streams and the normal data such that the plurality of supplementary data streams are continuously arranged to entirely occupy two or more segments among the plurality of segments of the transmission stream and face each other diagonally in an alternating pattern in the two or more segments.

3. The digital broadcast transmitter according to claim 2, wherein the two or more segments are an integer multiple of 52 segments.

4. The digital broadcast transmitter according to claim 1, wherein the at least one segment comprising only the supplementary data constitutes a single entire transmission unit in which no normal data is transmitted, and
wherein the single entire transmission unit is a unit by which the transmission stream is transmitted from the digital broadcast transmitter to the digital broadcast receiver.

5. The digital broadcast transmitter according to claim 1, wherein the MUX unit is configured to multiplex the supplementary data comprising a plurality of supplementary data streams and the normal data such that a single supplementary data stream of the plurality of supplementary data streams is repeatedly arranged in two or more segments among the plurality of segments of the transmission stream in a triangular shape, and
wherein at least two supplementary data streams, other than the single supplementary data stream, of the plurality of supplementary data streams are arranged vertically in a remaining area of the two or more segments in an alternating pattern.

6. The digital broadcast transmitter according to claim 5, wherein the MUX unit is configured to repeatedly insert the plurality of supplementary data streams such that a pattern of the supplementary data in the two or more segments is repeated in the plurality of segments of the transmission stream.

7. The digital broadcast transmitter according to claim 5, wherein the supplementary data included in the two or more segments is different from the supplementary data included in the repeated two or more segments.

8. The digital broadcast transmitter according to claim 1, wherein the exciter unit comprises an interleaver configured to interleave the transmission stream such that the supplementary data occupies an entire area of at least one transmission unit, and
wherein a transmission unit is a unit by which the transmission stream is transmitted from the digital broadcast transmitter to the digital broadcast receiver.

9. The digital broadcast transmitter according to claim 1, wherein the supplementary data comprises a plurality of supplementary data streams, and
wherein at least two supplementary data streams of the plurality of supplementary data streams are different from one another by type of data or coding rate.

10. The digital broadcast transmitter according to claim 1, wherein the transmission stream is divided into at least two fields, and the supplementary data comprises a plurality of supplementary data streams, and
wherein the plurality of supplementary data streams are repeatedly arranged in the same pattern in each of the at least two fields.

11. The digital broadcast transmitter according to claim 1, wherein the supplementary data comprises a plurality of supplementary data streams,
wherein the MUX unit is configured to multiplex the plurality of supplementary data streams and the normal data such that at least one supplementary data stream of the plurality of supplementary data streams is arranged as at least one transmission unit,
wherein a transmission unit is a unit by which the transmission stream is transmitted from the digital broadcast transmitter to the digital broadcast receiver, and
wherein no part of the normal data is disposed within the at least one transmission unit.

12. The digital broadcast transmitter according to claim 11, wherein the at least one supplementary data stream comprises two or more supplementary data streams which are alternately arranged with respect to one another in the at least one transmission unit.

13. A method for processing a transmission stream in a digital broadcast transmitter, the method comprising:
generating the transmission stream comprising a plurality of segments by multiplexing supplementary data and normal data; and
interleaving the transmission stream such that at least one segment of the plurality of segments comprises only the supplementary data among the supplementary data and the normal data, and another at least one segment of the plurality of segments comprises both the supplementary data and the normal data,
wherein the supplementary data arranged in the other at least one segment forms a plurality of horn-shape areas protruding from the at least one segment in the transmission stream, and the normal data is arranged between the horn-shape areas, and
wherein the supplementary data is data which is processed to be more robust against errors than the normal data, and is different from known data used for demodulation and equalization of the transmission stream at a digital broadcast receiver.

14. The method according to claim 13, wherein the supplementary data comprises a plurality of supplementary data streams, and
wherein, in the generating the transmission stream, the plurality of supplementary data streams are continuously arranged to entirely occupy two or more segments among the plurality of segments of the transmission stream and face each other diagonally in an alternating pattern in the two or more segments.

15. The method according to claim 14, wherein the two or more segments are an integer multiple of 52 segments.

16. The method according to claim 13, wherein the at least one segment comprising only the supplementary data constitutes a single entire transmission unit through which no normal data is transmitted, and
wherein the single entire transmission unit is a unit by which the transmission stream is transmitted from the digital broadcast transmitter to the digital broadcast receiver.

17. The method according to claim 13, wherein the supplementary data comprises a plurality of supplementary data streams, and
wherein the generating the transmission stream comprises:
repeatedly arranging a single supplementary data stream of the plurality of supplementary data streams in two or more segments of the plurality of segments of the transmission stream in a triangular shape; and
vertically arranging at least two supplementary data streams, other than the single supplementary data stream, of the plurality of supplementary data streams in a remaining area of the two or more segments in an alternating pattern.

18. The method according to claim 17, wherein the generating the transmission stream further comprises repeatedly inserting the plurality of supplementary data streams such that a pattern of the supplementary data in the two or more segments is repeated in the plurality of segments of the transmission stream.

19. The method according to claim 17, wherein the supplementary data included in the two or more segments is different from the supplementary data included in the repeated two or more segments.

20. The method according to claim 13, wherein in the processing the transmission stream, the transmission stream is interleaved such that the supplementary data occupies an entire area of at least one transmission unit, and
wherein a transmission unit is a unit by which the transmission stream is transmitted from the digital broadcast transmitter to the digital broadcast receiver.

21. The method according to claim 13, wherein the supplementary data comprises a plurality of supplementary data streams, and
wherein at least two supplementary data streams of the plurality of supplementary data streams are different from one another by type of data or coding rate.

22. The method according to claim 13, wherein the transmission stream is divided into at least two fields, and the supplementary data comprises a plurality of supplementary data streams, and
wherein the plurality of supplementary data streams are repeatedly arranged in the same pattern in each of the at least two fields.

23. The method according to claim 13, wherein the supplementary data comprises a plurality of supplementary data streams,
wherein the multiplexing the supplementary data and the normal data is performed such that at least one supplementary data stream of the plurality of supplementary data streams is arranged as at least one transmission unit,
wherein a transmission unit is a unit by which the transmission stream is transmitted from the digital broadcast transmitter to the digital broadcast receiver, and
wherein no part of the normal data is disposed within the at least one transmission unit.

24. The method according to claim 23, wherein the at least one supplementary data stream comprises two or more supplementary data streams which are alternately arranged with respect to one another in the at least one transmission unit.

25. A digital broadcast receiver for receiving a transmission stream from a digital broadcast transmitter, comprising:
a reception unit configured to receive the transmission stream comprising a plurality of segments which comprise normal data and supplementary data;
a demodulation unit configured to demodulate the transmission stream;
an equalization unit configured to equalize the demodulated transmission stream; and
a decoding unit configured to decode the supplementary data,
wherein the transmission stream is interleaved at the digital broadcast transmitter such that at least one segment of the plurality of segments comprises only the supplementary data among the supplementary data and the normal data, and another at least one segment of the plurality of segments comprises both the supplementary data and the normal data, and
wherein the supplementary data arranged in the other at least one segment forms a plurality of horn-shape areas protruding from the at least one segment in the transmission stream, and the normal data is arranged between the horn-shape areas, and
wherein the supplementary data is data which is processed to be more robust against errors than the normal data at the digital broadcast transmitter, and is different from known data used for demodulation and equalization of the transmission stream.

26. The digital broadcast receiver according to claim 25, wherein the supplementary data included in the at least one segment is transmitted as a transmission unit in which no normal data is transmitted, and
wherein the transmission unit is a unit by which the transmission stream is transmitted from the digital broadcast transmitter to the digital broadcast receiver.

27. The digital broadcast receiver according to claim 25, wherein the supplementary data included in the at least one segment comprises at least two supplementary data streams which are different from one another by type of data or coding rate.

28. The digital broadcast receiver according to claim 25, wherein the transmission stream is divided into at least two fields, and the supplementary data comprises a plurality of supplementary data streams, and
wherein the plurality of supplementary data streams have been repeatedly arranged in the same pattern in each of the at least two fields.

29. The digital broadcast receiver according to claim 25, wherein the transmission stream is divided into at least two fields, and the supplementary data comprises a plurality of supplementary data streams, and
wherein the plurality of supplementary data streams are inserted in an integer multiple of 52 segments.

30. The digital broadcast receiver according to claim 25, wherein the supplementary data comprises a plurality of supplementary data streams,
wherein the transmission stream has been processed such that at least one supplementary data stream of the plurality of supplementary data streams is arranged as at least one transmission unit,
wherein a transmission unit is a unit by which the transmission stream is transmitted from the digital broadcast transmitter to the digital broadcast receiver, and wherein no part of the normal data is disposed within the at least one transmission unit.

31. The digital broadcast receiver according to claim 30, wherein the at least one supplementary data stream comprises two or more supplementary data streams which are alternately arranged with respect to one another in the at least one transmission unit.

32. A method for processing a transmission stream in a digital broadcast receiver wherein the transmission stream is transmitted from a digital broadcast transmitter, the method comprising:

receiving the transmission stream comprising a plurality of segments which comprise normal data and supplementary data;

demodulating the transmission stream;

equalizing the demodulated transmission stream; and decoding the equalized supplementary data, wherein the transmission stream is interleaved at the digital broadcast transmitter such that at least one segment of the plurality of segments comprises only the supplementary data among the supplementary data and the normal data, and another at least one segment of the plurality of segments comprises both the supplementary data and the normal data, and wherein the supplementary data arranged in the other at least one segment forms a plurality of horn-shape areas protruding from the at least one segment in the transmission stream, and the normal data is arranged between the horn-shape areas, and wherein the supplementary data is data which is processed to be more robust against errors than the normal data at the digital broadcast transmitter, and is different from known data used for demodulation and equalization of the transmission stream.

33. The method according to claim 32, wherein the supplementary data included in the at least one segment is transmitted as a transmission unit in which no normal data is transmitted, wherein the transmission unit is a unit by which the transmission stream is transmitted from the digital broadcast transmitter to the digital broadcast receiver.

34. The method according to claim 32, wherein the supplementary data included in the at least one segment comprises at least two supplementary data streams which are different from one another by type of data or coding rate.

35. The method according to claim 32, wherein the transmission stream is divided into at least two fields, and the supplementary data comprises a plurality of supplementary data streams, and wherein the plurality of supplementary data streams have been repeatedly arranged in the same pattern in each of the at least two fields.

36. The method according to claim 32, wherein the transmission stream is divided into at least two fields, and the supplementary data comprises a plurality of supplementary data streams, and wherein the plurality of supplementary data streams are inserted in an integer multiple of 52 segments.

37. The method according to claim 32, wherein the supplementary data comprises a plurality of supplementary data streams, wherein the transmission stream has been processed such that at least one supplementary data stream of the plurality of supplementary data streams is arranged as at least one transmission unit, wherein a transmission unit is a unit by which the transmission stream is transmitted from the digital broadcast transmitter to the digital broadcast receiver, and wherein no part of the normal data is disposed within the at least one transmission unit.

38. The method of claim 37, wherein the at least one supplementary data stream comprises two or more supplementary data streams which are alternately arranged with respect to one another in the at least one transmission unit.

* * * * *